United States Patent [19]

Minemoto et al.

[11] Patent Number: 5,436,920
[45] Date of Patent: Jul. 25, 1995

[54] LASER DEVICE

[75] Inventors: Hisashi Minemoto, Otsu; Yusuke Ozaki, Toyonaka; Nobuo Sonoda, Settsu, all of Japan

[73] Assignee: Matsushita Electric Industrial Co., Ltd., Osaka, Japan

[21] Appl. No.: 245,631

[22] Filed: May 18, 1994

[30] Foreign Application Priority Data

May 18, 1993 [JP] Japan .................. 5-115626

[51] Int. Cl.⁶ ............................................. H01S 3/10
[52] U.S. Cl. ...................................... 372/21; 372/92; 372/66
[58] Field of Search ................... 372/21, 22, 92, 66

[56] References Cited

U.S. PATENT DOCUMENTS

| | | | |
|---|---|---|---|
| 5,051,617 | 9/1991 | Normandin et al. | 372/21 |
| 5,249,191 | 9/1993 | Sawaki et al. | 372/21 |
| 5,253,258 | 10/1993 | Lawandy | 372/21 |
| 5,341,390 | 8/1994 | Yamada et al. | 372/22 |
| 5,345,456 | 9/1994 | Dai et al. | 372/21 |
| 5,381,429 | 1/1995 | Minemoto et al. | 372/21 |

FOREIGN PATENT DOCUMENTS 4-335586 11/1992 Japan .
5-115626 5/1993 Japan .

OTHER PUBLICATIONS

"Second–Harmonic Generation with the GaAs Laser", Harold D. Edmonds et al., IEEE Journal of Quantum Electronics, vol. QE–6, No. 6, pp. 356–360, Jun. 1970.
"Periodically Poled LiNbO3 for High-Efficiency Second–Harmonic Generation", D. H. Jundt et al., Applied Physics Letter, vol. 59, pp. 2657–2659, Nov. 18, 1991.
"Anodic Bonding of Gallium Arsenide to Glass", Bertil Hok, et al., Applied Physics Letter, vol. 43, pp. 267–269, Aug. 1, 1983.

Primary Examiner—Leon Scott, Jr.
Attorney, Agent, or Firm—Wenderoth, Lind & Ponack

[57] ABSTRACT

A laser device including a wavelength converter of internal resonator type comprises a laser diode 20 for excitation, a light emission section 22 as a solid laser medium excited by the laser 20 and a wavelength converter 23 for converting the wavelength of the laser light from the excited solid laser. The solid laser medium of the light emission section 22 comprises a semiconductor crystal of GaAs, AlGaAs or GaAs-AlGaAs. A second harmonic wave light of a fundamental wave of 0.8 $\mu$m band can be easily generated by using a solid laser medium such as a GaAs crystal, an AlGaAs crystal or a superlattice crystal thereof.

22 Claims, 8 Drawing Sheets

LASER DEVICE

BACKGROUND OF THE INVENTION

1. Field of the Invention

The present invention relates to a laser device which can be used as a laser light source for a laser printer, an optical disc drive, optical measurement, a laser display and the like.

2. Description of the Prior Art

Recently, a laser device including a wavelength converter (for second harmonic generation, sum frequency generation, difference frequency generation or the like) using a secondary nonlinear optical material have been studied to provide a light source for optical information processing (for example for an optical disk player and for a laser printer), for various optical measurement apparatuses and for a laser display.

Laser devices including a wavelength converter are mainly classified into following two kinds: (1) In a laser device of first kind, a solid laser medium such as Nd:YAG or Nd:YVO$_4$ is excited by a laser diode, and a second harmonic wave (hereinafter referred to also as SH light) is generated by providing a wavelength converter (mainly a second harmonic generator) in an optical resonator of a solid laser device. Such a device uses a wavelength converter of inner resonator type. (2) In a laser device of second kind, a fundamental wave emitted from a laser diode is entered directly into a wavelength converter to take out a second harmonic wave. Such a device used a wavelength converter of external resonator type or that of waveguide type.

The laser device of first kind can convert wavelength relatively easily. Further, though an optical power of one to a few watts is needed for a light source of a laser display, such a large optical power output can be obtained relatively easily with a second harmonic generator of inner resonator type. However, a prior art Nd solid state laser medium has an oscillation wavelength of about 1.06 $\mu$m and has a second harmonic of green light of about 0.53 $\mu$m. Therefore, a second harmonic of a shorter wavelength than 0.53 $\mu$m. Though Nd:YAG crystal can generate laser light at 0.946 $\mu$n, a oscillation efficiency is lower about one order than for wavelength of 1.06 $\mu$m. Further, the oscillation efficiency depends on crystal temperature.

Recently, it is reported that laser media such as Cr:LiCaAlF$_6$ (hereinafter referred to as LiCAF) and Cr:LiSrAlF$_6$ (hereinafter referred to as LiSAF) having chromium as active ions can oscillate at a wavelength range between 0.7 and 1.0 $\mu$m due to excitation by a laser diode. However, if these laser crystals are used for a wavelength converter of inner resonator type, it is needed to select an oscillation frequency according to a birefringent filter and a grating, so that an optical resonator has a complicated structure. Further, because they are fluoride crystals, they are liable to react with air and hard to be grown. Because a fluorescent life of such oxides and fluorides is about 100 $\mu$sec, a laser light can be modulated only at about 10 kHz. However, if it is used for a record light source for an optical disk player or the like, it is required to modulate a light at a few MHz. Therefore, an external optical modulator which used an electro-optical or acousto-optic effect is needed newly.

A wavelength converter of inner resonator type using a laser diode is also proposed (for example, Harold D. et al.: IEEE J. Quantum Electronics, QE6, 356–360(1970)). However, a laser beam of an ordinary laser diode is emitted through a narrow waveguide (a section of 0.1 $\mu$m * a few $\mu$m), and the outgoing light has a large diverging angle. Therefore, If a lens or an output mirror is arranged outside a laser diode, a few tens % of the light reflected by the output side mirror returns to the waveguide in the laser diode, so that the amplitude of a fundamental wave in the optical resonator cannot be increased. Therefore, a laser device cannot be realized with a wavelength converter of high efficiency.

In a laser device of second type, a light of second harmonic of 0.4 $\mu$m band can be realized because a wavelength of a laser beam of a laser diode is converted directly. A second harmonic of wavelength of 0.3 $\mu$m or shorter may be generated if a light of a laser diode of a II–VI compound semiconductor such as CdZnSe, ZnSe or ZnMgSSe is used for a fundamental wave. However, a wavelength converter of external resonator type used in a laser device of the second type needs a complex wavelength control technique in order to coincide a wavelength of a laser diode with that of an optical resonator. Further, if a crystal itself for wavelength conversion is used as an optical resonator (for example, W. Lenth et al., Proceedings of SPIE, 1219, 21–29 (1990) and Japanese Patent laid open Publication No. 335586/1992), a very precise curve surface has to be formed on ends of the crystal, so that the laser device has a very high cost. Further, in a wavelength converter of waveguide type used for a laser device of second type, it is difficult to introduce a high power laser light into a section of a few $\mu$m * a few $\mu$m, so that a light source for laser display cannot be produced. Still further, it is difficult to introduce a light of laser diode into a wavelength converter of waveguide type efficiently and stably. A mechanism for stabilizing a wavelength is also needed in order to stabilize a wavelength of a light of a laser diode.

SUMMARY OF THE INVENTION

An object of the present invention is to provide a laser device having a simple structure, performing direct modulation and providing a high power as a light source with a short wavelength.

A laser device according to the present invention comprises components of a laser diode, a solid state laser medium, an optical resonator and a wavelength converter. The solid state laser medium is excited and emitted according to an incoming light from the laser diode. By using a III–V compound semiconductor crystal or a II–VI compound semiconductor crystal as the solid state laser medium, a laser device can be realized for an light source which can be modulated and has a high output power and has a short wavelength. For example, a laser light of wavelength of 0.9–0.6 $\mu$m band can be oscillated by using a III–V compound semiconductor crystal such as GaAs, AlGaAs or GaInP crystal. In this case, if a wavelength of a light source of laser diode for excitation (laser diode of GaAs or AlGaInP) is shortened than an absorption edge of a semiconductor material as the solid state laser medium, a laser light can be excited efficiently. Because wavelength conversion of inner resonator type is used, a simple structure can be adopted and a second harmonic of a half wavelength of 0.9–0.6 $\mu$m can be produced. A wavelength of a fundamental wave is determined mainly by a composition of a semiconductor crystal used as the solid state laser medium.

Preferably, the solid state laser medium comprises at least one selected among GaAs crystal, AlGaAs crystal and GaInP crystal and mixed crystals and superlattice crystals thereof or at least one selected among CdS, CdSe, ZnS, ZnSe, ZnTe, MgS, MgSe and mixed crystals and superlattice crystals thereof. Preferably, a mirror made of a multi-layer dielectric film is formed on at least one of principal planes of the solid state laser medium, and the end plane is adhered to a sapphire or a diamond substrate, or it is held directly on a holder made of Au, Ag, Cu, Al or an alloy thereof having a thermal conductivity of 100 $W \cdot m^{-1} \cdot K^{-1}$ or higher. Preferably, an excited power of the laser diode and a power of the generated second harmonic are monitored at the same time, and a temperature of optical components included in the second laser device is controlled. Preferably, a diameter of the principal plane of the solid state laser medium for contributing optical emission of the solid state laser medium is about the same as a diameter of a beam emitted by the laser diode. Preferably, a multi-layer dielectric film for transmitting a fundamental wave and reflecting harmonics is formed on a principal plane of the wavelength converter at a side of excitation. Preferably, the wavelength converter is made of a nonlinear optical material for wavelength conversion selected among KTiOPO$_4$ (KTP), LiNbO$_4$ (LN), LiTaO$_3$ (LT), KNbO$_3$ (KN), LiIO$_3$, $\beta$-BaB$_2$O$_4$ (BBO), LIB$_3$O$_5$ (LBO) or an organic ionic crystal.

An advantage of the present invention is to provide a laser device for a light source having a simple structure, used for direct modulation and used for a short wavelength light.

Another advantage of the present invention is to provide a laser device having a simple element structure of a light emitting section.

A further advantage of the present invention is to provide a light source for generating a second harmonic of a high power and with a high conversion efficiency.

BRIEF DESCRIPTION OF THE DRAWINGS

These and other objects and features of the present invention will become clear from the following description taken in conjunction with the preferred embodiments thereof with reference to the accompanying drawings, and in which.

DETAILED DESCRIPTION OF THE PREFERRED EMBODIMENTS

Referring now to the appended drawings, wherein like reference characters designate like or corresponding parts throughout views, embodiments of the invention are explained. In the present invention, a laser device uses a semiconductor crystal (a III-V compound semiconductor crystal or a II-VI compound semiconductor crystal) as a solid state laser medium to produce a light of a fundamental wave of 0.9 to 0.6 μm band and 0.5 to 0.4 μm band and generates a laser light of a half wavelength thereof by using a wavelength converter of inner resonator type.

According to the present invention, a laser device which can modulate and be used as a high power light source of short wavelength can be provided by using a III-V compound semiconductor crystal or a II-VI compound semiconductor crystal as a solid state laser medium. That is, a laser light of wavelength of 0.9 to 0.6 μm band can be generated by using a II-VI compound semiconductor crystal such as GaAs, AlGaAs or AlGaInP. By making a wavelength of a light source of a laser diode (a laser diode of GaAs or AlGaInP) for excitation shorter than that of an absorption end of a semiconductor material used as a solid state laser medium, a laser light can be excited efficiently.

Following advantages can be realized by a laser device of the invention. (1) A laser device using a III-V compound semiconductor crystal or a II-VI compound semiconductor crystal as a solid state laser medium has a simple structure, is used for direct modulation and is used for a light source of short wavelength. (2) By using an optical excitation, a structure of a light emission section can be simplified because only confinement of carriers generated by the optical excitation is needed to be taken into account, while current confinement or low resistance for current flow are not needed in contrast to an ordinary laser diode. (3) Because a beam quality of laser diode for excitation is not required so high (both in the longitudinal and transverse modes), a laser diode of a high power in a multi-mode can be used both in the longitudinal and transverse modes. An output power of a second harmonic wave is proportional to a square of a power of incoming light. Therefore, a use of such a laser diode of high power is very advantageous for realizing a light source to generate a second harmonic wave of high output power efficiently. The present invention provides such advantages and is valuable for industrial usages.

A laser light of wavelength of 0.5–0.4 μm band can be produced by using at least one selected among CdS, CdSe, ZnS, ZnSe, ZnTe, MgS, MgSe and mixed crystals thereof as a II-VI compound semiconductor crystal and superlattice crystals thereof.

A laser diode of a II-VI compound semiconductor such as CdZnSe, ZnSe or ZnMgSSe can be used for a laser diode for excitation.

A life of fluorescent rays in these semiconductor crystals is about a few nsec, so that modulation is possible up to at least about a few hundred MHz by modulating a light source for excitation. Therefore, it is a characteristic that an optical modulator is not needed newly as a light source for an optical disk, a laser display or the like. On the other hand, if an oxide crystal or a fluoride crystal is used as a solid state laser medium, a modulation frequency is as low as a few tens kHz, and a new optical modulator is needed for a light source for an optical disk, a laser display or the like.

Next, a solid state laser medium has a dielectric (or semiconducting) multi-layer film at least on one of the principal planes, and an output mirror is arranged at a side opposite to the multi-layer film. The solid state laser medium can receive heat efficiently because it is adhered to a sapphire or diamond substrate or it is fixed directly on a base of a highly thermally conducting material such as copper. A laser device of this structure is a bulk laser device of optical excitation type, without using a waveguide structure. This laser device can solve the above-mentioned problem of a prior art device on wavelength conversion of inner resonator type of a laser diode with a waveguide that only a few tens percent of laser light returns back to the optical waveguide (or a loss in an optical resonator is very large).

By using optical excitation, a simple structure of a light emission section can be adopted because current confinement or low resistance for current flow are not needed to be taken into account in contrast to an ordinary laser diode (or only confinement of carriers generated by the optical excitation is needed to be considered). Further, because a beam quality of laser diode for excitation is not required so high (both in the longitudinal and transverse modes), a laser diode of a high power in multi-mode can be used both in the longitudinal and transverse modes. Because an output power of a second harmonic wave is proportional to a square of a power of an incident light, such a laser diode of high power is used very advantageously for producing a light source for generating a second harmonic wave of high output power efficiently. On the other hand, a prior art high output power laser diode having a wide waveguide width (a few tens μm or wider) has a multi-mode both in the longitudinal and transverse modes, and it cannot be used for a second harmonic generator of waveguide type or external resonator type.

As a nonlinear optical material, KTiOPO$_4$ (KTP), LiNbO$_3$ (LN), LiTaO$_3$ (LT), KNbO$_3$ (KN) and LiIO$_3$ are effective because they have relatively large nonlinear optical constants. Because wavelengths of absorption edge for $\beta$-BaB$_2$O$_4$ (BBO) and LiB$_3$O$_5$ (LBO) are as short as 0.2 μm or less, they can be used to generate a second harmonic wave up to an ultraviolet light, and a combination with a II–VI compound semiconductor crystal is preferable. For a nonlinear optical material such as KTiOPO$_4$, LiNbO$_3$ or LiTaO$_3$, a material having dielectric polarization reversed periodically can be used as a wavelength converter. In this case, by adjusting reverse periods of dielectricpolarization, phase matching (so-called pseudo-phase matching, for example refer D. H. Jundt et al.: Appl. Phys. Lett. 59, 2657–2659 (1991)) is performed at any wavelength, and it is very advantageous that it is not needed to change a kind of a wavelength conversion material. On the other hand, an organic ionic crystal is a kind of an organic nonlinear optical material, and it is effective for wavelength conversion at a low output power because a nonlinear optical constant is expected to be very large.

A structure of the solid state laser medium is explained next. If a semiconductor crystal is used as the solid state laser medium, carriers excited optically do not stay at the excited site but diffuse or annihilate at a crystal surface due to recombination without light emission, so that carrier density decays fast. It is effective to confine carriers to provide a blocking layer for enclosing excited carriers at a specified space. This is desirable because carriers do not diffuse to a crystal surface where recombination without light emission is liable to occur. Such a confinement structure can be realized by covering an optically excited site (or light-emitting site) with a material having a larger energy band gap than the site.

For example, a GaAs crystal and AlGaAs are used as a solid state laser medium of 0.8 μm band and a material having a larger energy band gap for carrier confinement, respectively. Since an absorption coefficient depends on wavelength of light of laser diode for excitation, a crystal is required to have a thickness enough to absorb the excited light. Usually, a thickness of GaAs crystal is a few to a few tens μm or less. In a simplest way, a thin plate crystal of thickness of a few to a few tens μm can be produced by using mechanochemical polishing of a GaAs substrate, wet etching and the like. In a different process, on a GaAs substrate, AlGaAs is grown up to a thickness of 0.2 μm, GaAs is grown up to a thickness of a few to a few tens μm, and further AlGaAs is grown up to a thickness of 0.2 μm, successively. Then, the GaAs substrate is polished down to a thickness of a few tens μm or less. Finally, a remaining GaAs substrate is removed completely by selective etching. In this example, a GaAs thin plate crystal of thickness of a few to a few tens μm sandwitched with the two AlGaAs layers of thickness of 0.2 μm. In order to improve light emission efficiency as a solid state laser medium, a thin plate of a GaAs-AlGaAs multiple quantum well structure may be used as a light emission layer.

The thin plate crystal is adhered to a sapphire or diamond crystal. For adhesion, an appropriate organic adhesive may be used. However, it is desirable to use techniques such as optical contact or anodic oxidation (refer for example Bertil Hok et al.: Appl. Phys. Lett., 43, 267–269 (1983)) from viewpoints of heat radiation and reliability. Further, if the sapphire or diamond substrate is adhered to a material made of Ag, Cu, Au, Al or an alloy thereof having a thermal conductivity of 100 W·m$^{-1}$·K$^{-1}$ or higher by using a thermally conducting paste, a screw, a solder or the like, heat generated in the solid state laser medium can be emitted effectively. On the other hand, the solid state laser medium nay be adhered directly to a base having good thermal conduction.

Next, by using a photoprocess or etching process, it is formed as a disk having a diameter about the same as that of beam size of a laser beam of a laser diode for excitation. For example, a peripheral thereof is removed to have a diameter of about a few to 20 μm. For wavelength conversion for a high power of one to a few Watt, the peripheral is removed to have a diameter of about 100 to 1000 μm of about the same as that of beam size of a laser beam of the laser diode for excitation. Further, in order to suppress diffusion of carriers to a crystal surface, AlGaAs (for example Al$_{0.3}$Ga$_{0.7}$As) is grown epitaxially on the crystal surface. Next, output mirrors are provided on one principal plane and on an opposing one of the semiconductor crystal, to construct an optical resonator between the two output mirrors. A mirror of a dielectric multi-layer film deposited on an optical glass substrate may be used without using one of the principal planes as one of the two mirrors of the optical resonator. A laser diode having a good electrooptic conversion efficiency is used as a light source for optical excitation. For example, an AlGaAs laser diode (wavelength 0.8 μm band) or an AlGaInP laser diode (wavelength 0.6 μm band) may be used as the laser diode.

As a nonlinear optical material, KTiOPO$_4$ (KTP), LiNbO$_4$ (LN), LiTaO$_3$ (LT), KNbO$_3$ (KN), LiIO$_3$ and the like may be used. Phase matching is possible up to about 0.6 μm of fundamental wave for LiIO$_3$ and up to about 0.84 μm for KNbO$_3$. As an organic ionic crystal, sodium p-nitrophenoxyacetate or the like may be used, as disclosed in Japanese patent application No. 61680/1993. Phase matching cannot be performed at a wavelength of 1 μm band or less for a bulk crystal of KTiOPO$_4$ or LiNbO$_3$. Phase matching cannot be performed at all for a bulk LiTaO$_3$ because of its small birefringence quantity, so that so-called pseudo-phase matching is required. For pseudo-phase matching, an ion diffusion process of rubidium the like is used for KTiOPO$_4$. As to LiNbO$_3$ and LiTaO$_3$, a combe-like electrode is formed, and poling is performed under a high electric field. Alternatively, a crystal of periodically reversed dielectric polarization is prepared by adding elements such as yttrium on crystal growth and by pulling up a crystal under crystal growth conditions which fluctuate a few to a few tens times per minute (Czochralski process).

A wavelength converter prepared by using the above-mentioned nonlinear optical material is arranged in an optical resonator in a laser device, so that a laser device using wavelength conversion of an internal resonator type can be realized. The temperature of the wavelength converter and/or optical components can be controlled if necessary. This laser device uses wavelength conversion of internal resonator type, and it can convert a wavelength effectively in a simple structure. Therefore, complicated wavelength stabilization control and complex forming of a wavelength conversion crystal are nearly needed in contrast to prior art wavelength converters of external resonator type and of waveguide type.

If a II-VI compound semiconductor crystal is used as the laser medium, for example ZnSe is grown epitaxially on a GaAs substrate and the substrate is removed by polishing and etching thereafter, to result a ZnSe thin plate. As the laser diode for excitation, a II-VI compound laser diode of CdZnSe, ZnSe ZnMgAAe or the like is used as the II-VI compound laser diode. As the nonlinear optical material for wavelength conversion, β-BaB$_2$O$_4$ or LiB$_3$O$_5$ may be used. A laser device for short wavelength can be constructed similarly to a prior art one except the above-mentioned points.

If it is needed for oscillation spectra to have a single mode in order to stabilize an optical amplitude of a second harmonic wave, an etalon plate is provided in the optical resonator. If polarization of light is needed to be controlled, a polarization control element such as a Brewster plate is provided in the optical resonator.

A stable output light of second harmonic can be obtained if a laser power of laser diode for excitation and an output of the second harmonic generator are monitored by photodetectors at the same time and the temperature of main components of the laser device is kept constant.

The present invention is explained further with reference to embodiments.

(First Embodiment)

Figure 1:
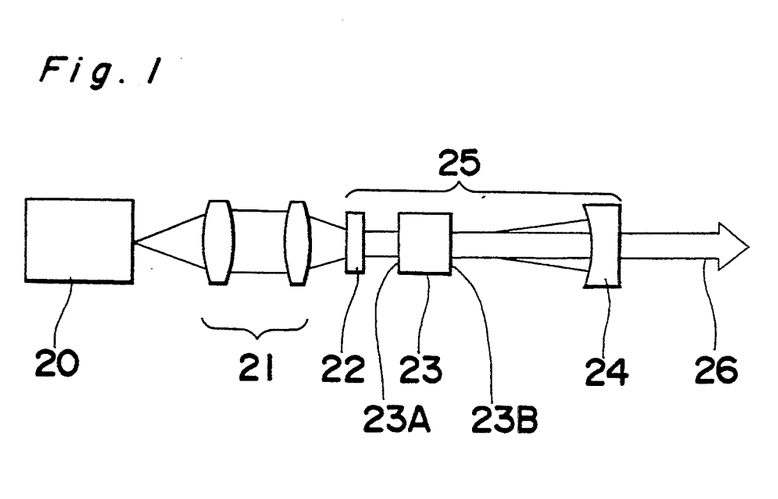
FIG. 1 is a schematic diagram for illustrating a structure of a laser device of a first embodiment of the invention.

FIG. 1 shows a laser device of the invention schematically. An AlGaAs semiconductor laser diode is used as a light source of laser diode for excitation. A light emitted from the laser diode light source 20 is condensed through a lens system onto a light emission section 22.

Figure 2:
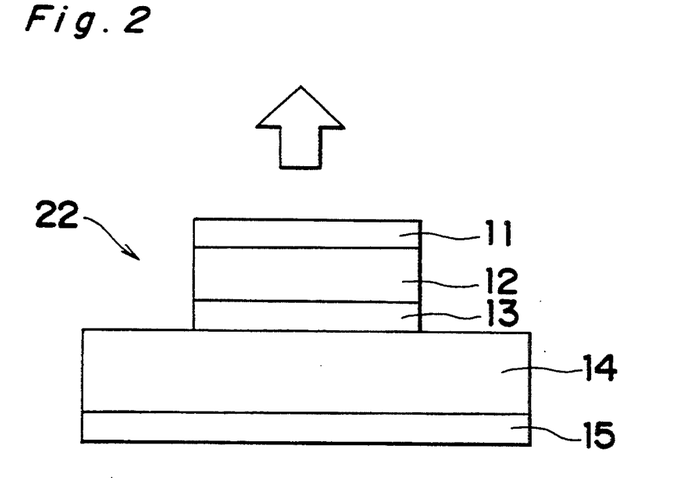
FIG. 2 is a schematic sectional view of a light emission section used in the laser device.

FIG. 2 shows a structure of the light emission section 22. The thickness of a GaAs crystal layer 12 is 2 μm. Because an optical absorption coefficient of GaAs crystal is $1.4 * 10^4$ (cm$^{-1}$) at wavelength of 780 nm, 94% or more of the excited light is absorbed through the crystal thickness of 2 μm. An antireflection coating made of a dielectric multi-layer film 11 is deposited on a principal plane of the GaAs crystal layer 12 at a side of the output mirror 24, wherein TiO$_2$, CeO$_2$ or the like is used as a higher refractive index material while SiO$_2$, MgF$_2$ or the like is used as a lower refractive index material, as dielectric materials for the dielectric multi-layer film 11. Then, an antireflection coating can transmit 99% or more of a light of wavelength of 0.88 μm. On the other principal plane of the GaAs crystal layer 12 at a side of excitation, a dielectric multi-layer mirror 13 is provided which transmits a light of excited wave of wavelength of 0.78 μm but reflects 99% or more of a light of wavelength of 0.88 μm of fundamental wave. The dielectric multi-layer mirror 13 is adhered to a sapphire (Al$_2$O$_3$) substrate 14 with optical contact. A portion consisting of the GaAs crystal layer 12 and the dielectric multi-layer films 11 and 13 fixed to the sapphire substrate 14 is formed to have a diameter of 10 μm by photoprocess and dry etching. An antireflection coating made of a dielectric multi-layer film 15 is deposited on a side of incoming excited light to transmit a light of wavelength of 0.78 μm efficiently. The light emission section 22 is fixed to a copper holder to radiate heat effectively.

An outgoing light from the light emission section 22 excited by the laser diode 20 for excitation passes through a wavelength converter 23 to change a wavelength and enters into the output mirror 24. The output mirror 24 is made of a dielectric multi-layer film which reflects 99% or more of a light of wavelength of 0.88 μm of fundamental wave but transmits 95% or more of a light of second harmonic wave of wavelength of 0.44 μm. The light emission section 22 is excited by the laser diode 20 for excitation and reflection of a light of wavelength of 0.88 μm is repeated between the mirror 13 at the side of excitation and the output mirror 24 in the optical resonator to cause oscillation. The light of the laser diode 20 is condensed to a beam diameter of about 10 μm in the GaAs crystal in the light emission layer 12. Because the light of wavelength of 0.88 μm of the fundamental wave is confined within the optical resonator, the optical amplitude of the fundamental wave increased in the optical resonator.

The wavelength converter 23 is made of a LiIO$_3$ crystal, which is cut for phase matching at wavelength of 0.88 μm. Further, a dielectric multo-layer film which transmits a light of wavelength of 0.88 μm but reflects a light of wavelength of 0.44 μm of a second harmonic thereof is provided on a plane 23A of a crystal surface at a side of the light emission section. Another dielectric multi-layer film is deposited on a plane 23B of the wavelength converter 23 at a side of the output mirror for transmitting lights of both wavelengths of 0.88 and 0.44 μm. Therefore, by arranging the wavelength converter 23 made of LiIO$_3$ within an optical resonator, a second harmonic wave of wavelength 0.44 μm of a light of wavelength 0.88 μm having a large amplitude in the optical resonator can be taken out efficiently through the output mirror 24. In the laser device having the above-mentioned structure, a second harmonic wave of wavelength 440 μm of 1 mW can be generated by using a laser power of 200 mW of the laser diode for excitation.

It is confirmed that a fundamental wave can be modulated up to 500 MHz by modulating an excitation power of the laser diode 20 of wavelength 780 nm for excitation and that a second harmonic wave of wavelength 440 nm is modulated up to 500 MHz. The modulation frequency of 500 MHz is limited by a drive circuit for the laser diode for excitation, and it can be extended up to a higher frequency.

Figure 3:
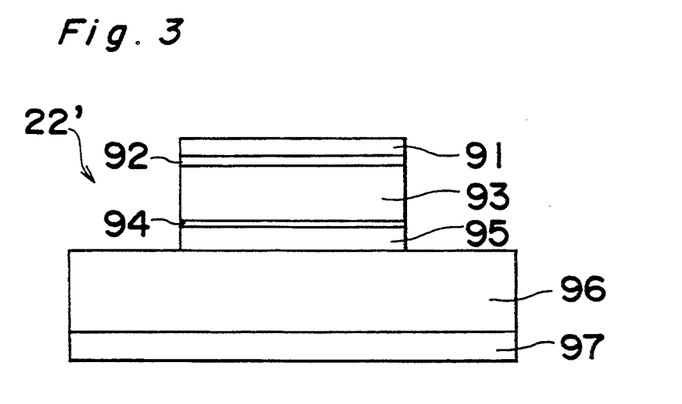
FIG. 3 is a schematic sectional view of another light emission section used in the laser device.

FIG. 3 shows a modified example of a light emission section 22'. The light emission section 22' is prepared with a II-VI compound semiconductor thin film crystal. A GaAs substrate of thickness of 50 $\mu$m is prepared by decreasing its thickness with polishing and etching. Then, a ZnSe layer 92 of thickness of 0.2 $\mu$m as a blocking layer, a $Zn_{0.7}Cd_{0.3}Se$ layer 93 of thickness of 2 $\mu$m as a light emitting layer and a ZnSe layer 94 of thickness of 0.2 $\mu$m as a blocking layer are grown on the GaAs substrate with an electron beam epitaxy process (MBE). Then, the GaAs substrate is removed completely with selective etching. Next, a dielectric multi-layer film 91 transmitting a light of wavelength of 530 nm is deposited on a plane of the thin film crystal, while another dielectric multi-layer film 95 transmitting a light of wavelength of 440 nm for excitation but reflecting 99% or more of a light of a fundamental wave of wavelength of 530 nm is deposited on an opposite plane of the thin film crystal. The obtained crystal is adhered to a sapphire substrate 96 with optical contact process. A dielectric multi-layer film 97 transmitting a light of wavelength of 480 nm for excitation is deposited on a plane of the sapphire substrate 96.

The laser emission section 22' of laser medium having the above-mentioned structure is used instead of the counterpart 22 in the laser device shown in FIG. 1. Further, there are several changes from the structure shown in FIG. 1. As to the laser diode 20 for excitation, a ZnSe laser diode used is cooled at liquid nitrogen temperatures and is excited at wavelength of 480 nm. Further, the output mirror 24 for outgoing laser beam comprises a mirror which reflects 99% or more of a light of a fundamental wave of wavelength of 530 nm but transmits 95% or more of a second harmonic wave thereof of wavelength of 265 nm. The wavelength converter 23 is made of a BBO crystal. Otherwise the structure of the optical system of the modified example is the same as that shown in FIG. 1 of the first embodiment. An ultraviolet wave of wavelength of 265 nm of 0.1 mW is generated for 100 mW of laser power of the laser diode for excitation. Further, by modulating an excitation power of the laser diode 20 for excitation of wavelength of 480 nm, a second harmonic wave of wavelength of 265 nm can be confirmed up to 500 MHz.

(Second Embodiment)

Figure 4A:
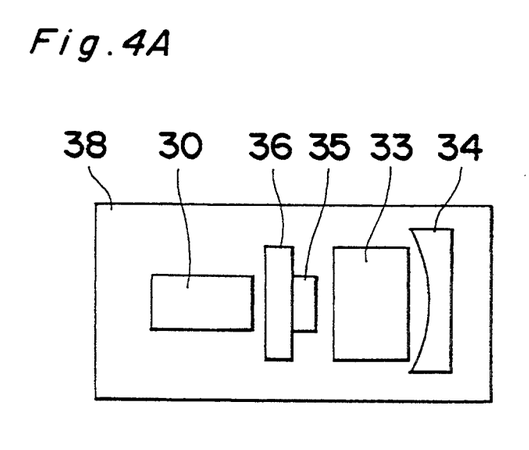
FIG. 4A and FIG. 4B are a plan view and a front view of a compact laser device of a second embodiment of the invention, respectively.
Figure 4B:
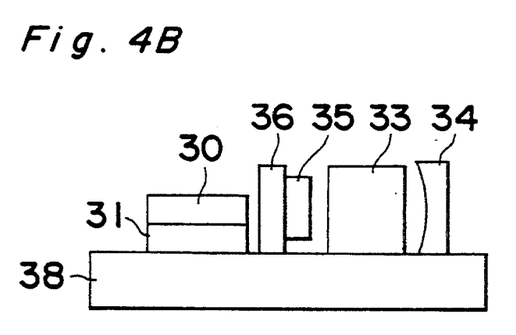

FIGS. 4A and 4B are a plan view and a front view of a compact laser device of wavelength of 440 nm of a second embodiment of the invention, respectively. A silicon (Si) block 38 is used as a base for arranging a laser device. This is ascribed to a large thermal conductivity of silicon of 168 W·m$^{-1}$·K$^{-1}$ and a linear expansion coefficient of silicon of $4*10^{-8}$ °C.$^{-1}$ smaller by an order than an ordinary metal, and this reduces a shift of an optical axis of the resonator. A laser diode chip 30 is mounted on a heat sink 31, which is adhered to the silicon block 38. A light emission section 35 having a similar structure to that of FIG. 2 but having a diameter of 30 $\mu$m of the light emission section is adhered to a sapphire substrate 36. Then, it is fixed to the silicon block 38 with a solder or the like. A metal such as gold is deposited on a portion for fixing it to the silicon block 38 for wetting with the solder. An outgoing light from the laser diode chip 30 excites the light emission section 35 without using a lens. A wavelength converter 33 and an output mirror 34 are similar to the counterparts in the first embodiment. The wavelength converter 33 is fixed with an adhesive agent having a good thermal conductance. Finally, the output mirror 34 is fixed with a solder, by adjusting to oscillate a fundamental wave of wavelength 880 nm stably by driving the laser diode chip 30 and to have a maximum output of a second harmonic wave thereof. A second harmonic wave of wavelength of 440 nm of 0.7 mW is generated for an excitation power of 2.00 mW of the laser diode.

(Third Embodiment)

Figure 5A:
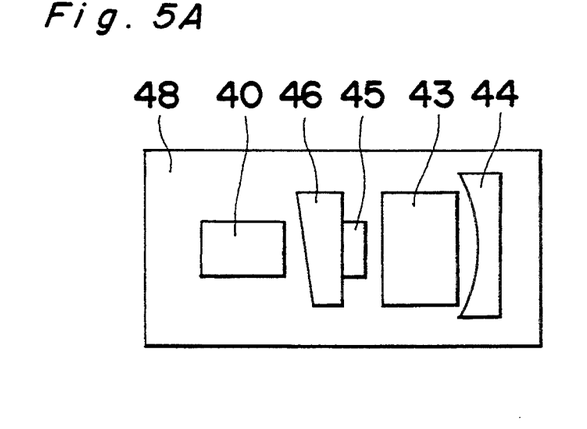
FIG. 5A and FIG. 5B are a plan view and a front view of a compact laser device of a third embodiment of the invention, respectively.
Figure 5B:
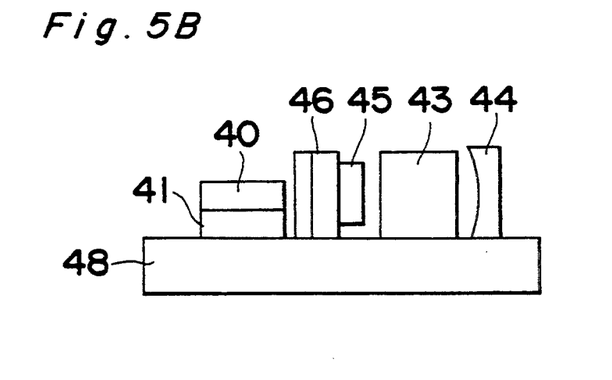

FIGS. 5A and 5B show another compact laser device of wavelength of 440 nm of a third embodiment of the invention. A laser diode chip 40 is mounted on a heat sink 41, which is adhered to a copper block 48. A light emission section 45 having a similar structure to that of FIG. 2 (but with a diameter of 30 $\mu$m of the light emission section) is adhered to a sapphire substrate 46. Then, it is fixed to the copper block 48 with a solder or the like. A metal such as gold is deposited on a portion for fixing to the copper block 48 for wetting with the solder. The sapphire substrate 46 at a side of the laser diode is tilted by an angle of 5°–15° from a vertical direction in order to prevent return of reflected light to the laser diode 40. An antireflection coating is provided on the sapphire substrate 46 in order to prevent return of a slightly reflecting light to the laser diode 40. A wavelength converter 43 and an output mirror 44 are similar to the counterparts in the first embodiment. An adhesive of good thermal conduction is used to fix the wavelength converter 43. Finally, the output mirror 44 is fixed with a solder, by adjusting to oscillate a fundamental wave of wavelength 880 nm stably according to the driving of the laser diode chip 40 and to have a maximum output of a second harmonic wave thereof.

A second harmonic wave of wavelength of 440 nm of 0.8 mW is generated for an excitation power of 200 mW of the laser diode. Further, because a reflecting return light from the sapphire substrate 46 does not enter the laser diode 40, a second harmonic wave can be generated more stably than in the second embodiment.

(Fourth Embodiment)

In order to improve a laser device of the invention more efficiently and to generate a higher power, it is effective to improve confinement efficiency of carriers at a light emission section and to enhance heat radiation. FIGS. 6A–6F illustrates a process for producing a light emission section wherein confinement efficiency of carriers can be improved and heat radiation can be enhanced.

Figure 6A:
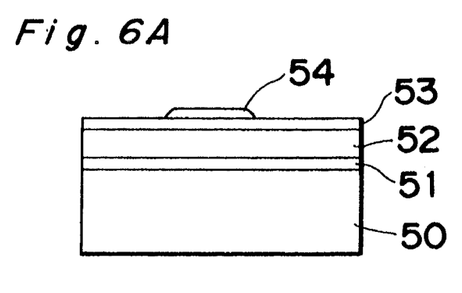
FIGS. 6A, 6B, 6C, 6D, 6E and 6F are diagrams for illustrating a process for producing a light emission section in a fourth embodiment of the invention.

As shown in FIG. 6A, an $Al_{0.3}Ga_{0.7}As$ layer 51 of thickness of 0.2 $\mu$m, a GaAs active layer 52 of thickness of 2 $\mu$m and an $Al_{0.3}Ga_{0.7}As$ layer 53 of thickness of 0.2 $\mu$m are grown successively on a GaAs substrate 50 with a liquid phase epitaxial (LPE) process. Next, a $SiO_2$ layer is formed and a circular mask 54 having an area about the same as a desired area of a light emission section is formed with photolithography.

Figure 6B:
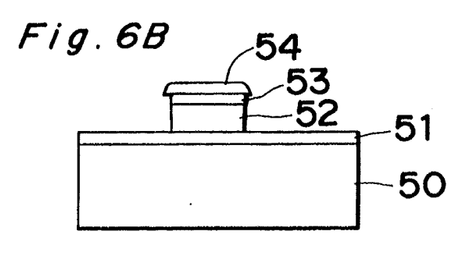

Next, as shown in FIG. 6B, a columnar portion 54' for a light emission layer is formed with dry etching and wet etching.

Figure 6C:
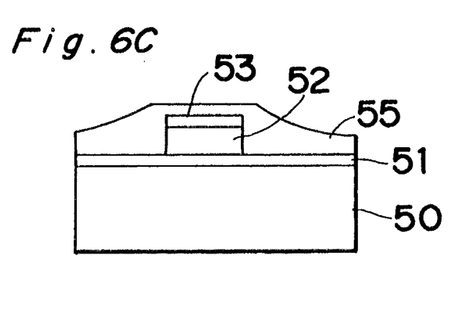

Then, as shown in FIG. 6C, a blocking layer (an Al$_{0.3}$Ga$_{0.7}$As layer) 55 for carrier confinement is grown to a thickness of 0.5-2 μm. Next, the GaAs substrate 50 is polished to a thickness as thin as about 50 μm, and then damages due to polishing is removed with wet etching.

Figure 6D:
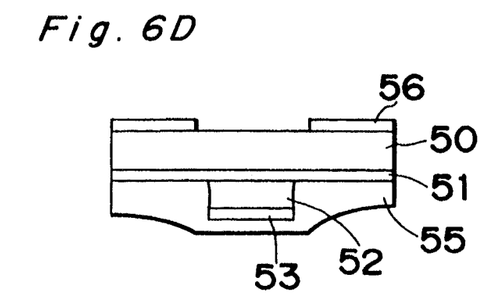

Then, as shown in FIG. 6D, a resist layer 56 is formed on the GaAs layer 50, and a circular pattern somewhat larger than an effective area of the light emission section is formed in the photoresist layer 56.

Figure 6E:
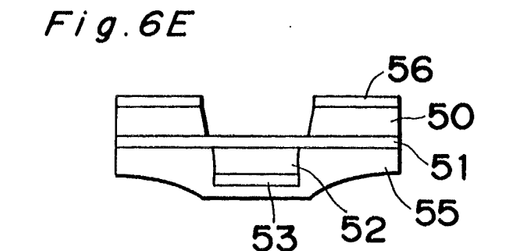

Next, as shown in FIG. 6E, a GaAs substrate 50 is etched selectively with 1 normality of NH$_4$OH:H$_2$O$_2$ (=1:20).

Figure 6F:
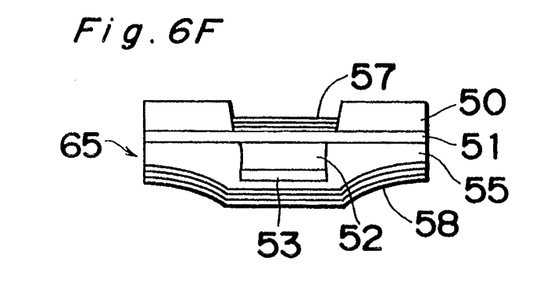

Finally, as shown in FIG. 6F, dielectric multi-layer films 57 and 58 are formed at a side of optical excitation and at an opposite one thereof, respectively. The dielectric multi-layer film 58 on a principal plane at the side of optical excitation transmits a light of excited wavelength of 0.78 μm and reflects 99% or more of a light of fundamental wave of wavelength of 0.88 μm. On the other hand, the dielectric multi-layer film 57 on a principal plane at a side of output mirror transmits 99% or more of a light of wavelength of 0.88 μm, as an antireflection coating. Thus, the light emission section 65 is completed.

(Fifth Embodiment)

Figure 7:
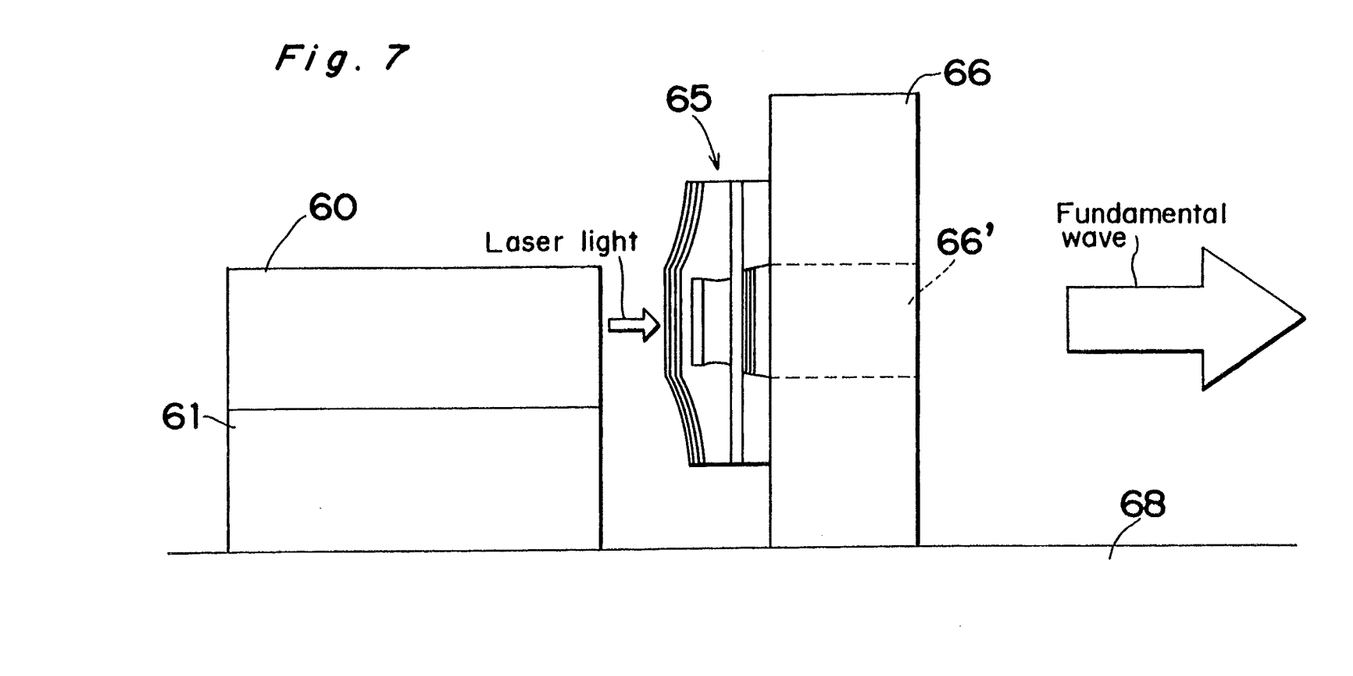
FIG. 7 is a diagram of fixing a light emission section of a fifth embodiment of the invention.
Figure 8:
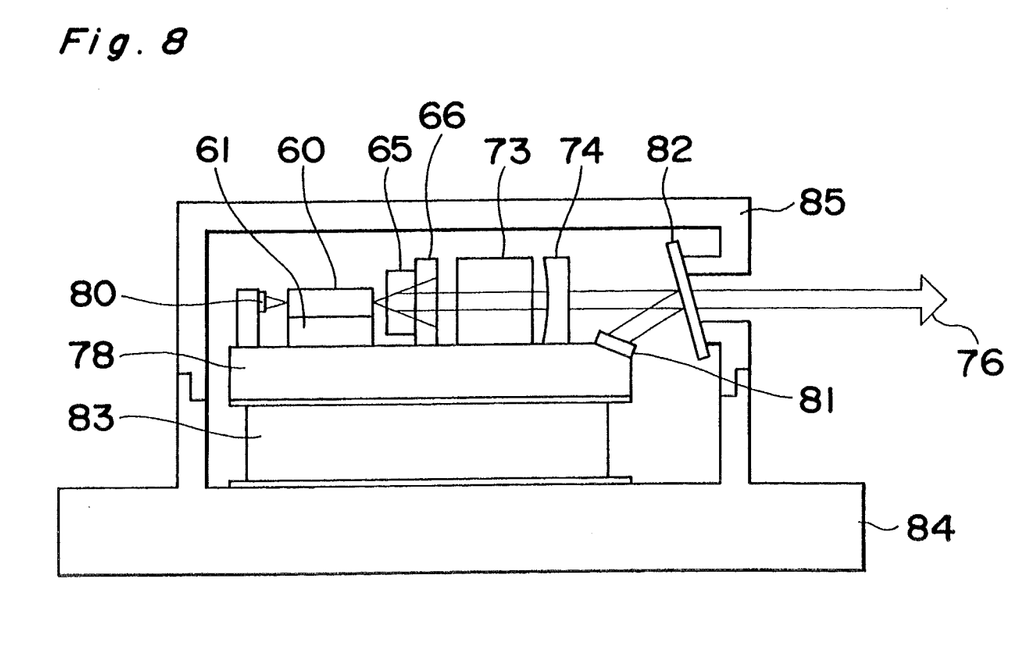
FIG. 8 is a schematic diagram for illustrating a structure of a laser device of the fifth embodiment of the invention.

Next, FIGS. 7 and 8 show an example of a small laser device using a light emission section 65 similar to that shown in FIG. 6F. FIG. 7 shows how the light emission section 65 is mounted. The light emission section 65 is fixed with a solder or the like to a copper plate 66 which has a throughhole 66a for transmitting a fundamental wave. Further, the copper plate is fixed to a copper block 68. Therefore, a heat generates as non-light-emitting components in the light emission section 65 is conducted to the copper block 68 efficiently. By using a light from a laser diode chip 60 mounted on the same copper block 68, a light is excited directly (without using a lens).

FIG. 8 shows an entire structure of the small laser device. Similarly to the embodiment shown in FIG. 4A, the laser diode mounted on a heat sink 61, the light emission section 65 mounted on the copper plate 66, a wavelength converter 73 and an output mirror 74 are arranged successively on a copper block 78. The wavelength converter 73 is made of a KNbO$_3$ crystal. A photodiode 80 is arranged at an opposite side to the light emission section 65 with respect to the laser diode chip 60 in order to monitor a laser light power of the laser diode chip for excitation. The copper block 78 is put via an Peltier element 83 over a case 84. The case 84 is integrated with a case 85 as one body to enclose the Peltier element 83, the copper block 78 and the components 60-75 thereon. A light goes out to the external from the output mirror 74 through a window in the case 85. Further, a photodiode 81 for monitoring an output of generated second harmonic wave is provided on the copper block 78. The entire optical system is subjected to temperature control at a precision of ±0.02° C. with the Peltier element 83. The entire laser device is sealed hermetically in a dry nitrogen environment within the cases 84 and 85.

In the laser device, a second harmonic wave of 3 mW can be obtained for 200 mW of excitation power of the laser diode. The stability of the laser power fluctuation is ±2% or less per one hour. This is ascribable to the feedback control according to the monitoring of the output power.

In a modified example of the fifth embodiment, a light emission section similar to that of the fourth embodiment and a KNbO$_3$ crystal are used to construct an optical system similar to FIG. 8 to generate a high power laser light. An effective diameter of the light emission section 65 is about 500 μm. The laser diode 60 for excitation has a stripe width of 500 μm and generates a multi-mode in the longitudinal and transverse modes. A wavelength converter 73 using a KNbO$_3$ crystal is controlled at a precision of ±0.02° C. by the Peltier element 83. In the laser device, a second harmonic light of wavelength of 440 nm of 2 W can be obtained for 4 W of excitation power. The laser device can be used as a light source of a laser display.

(Sixth Embodiment)

Figure 9:
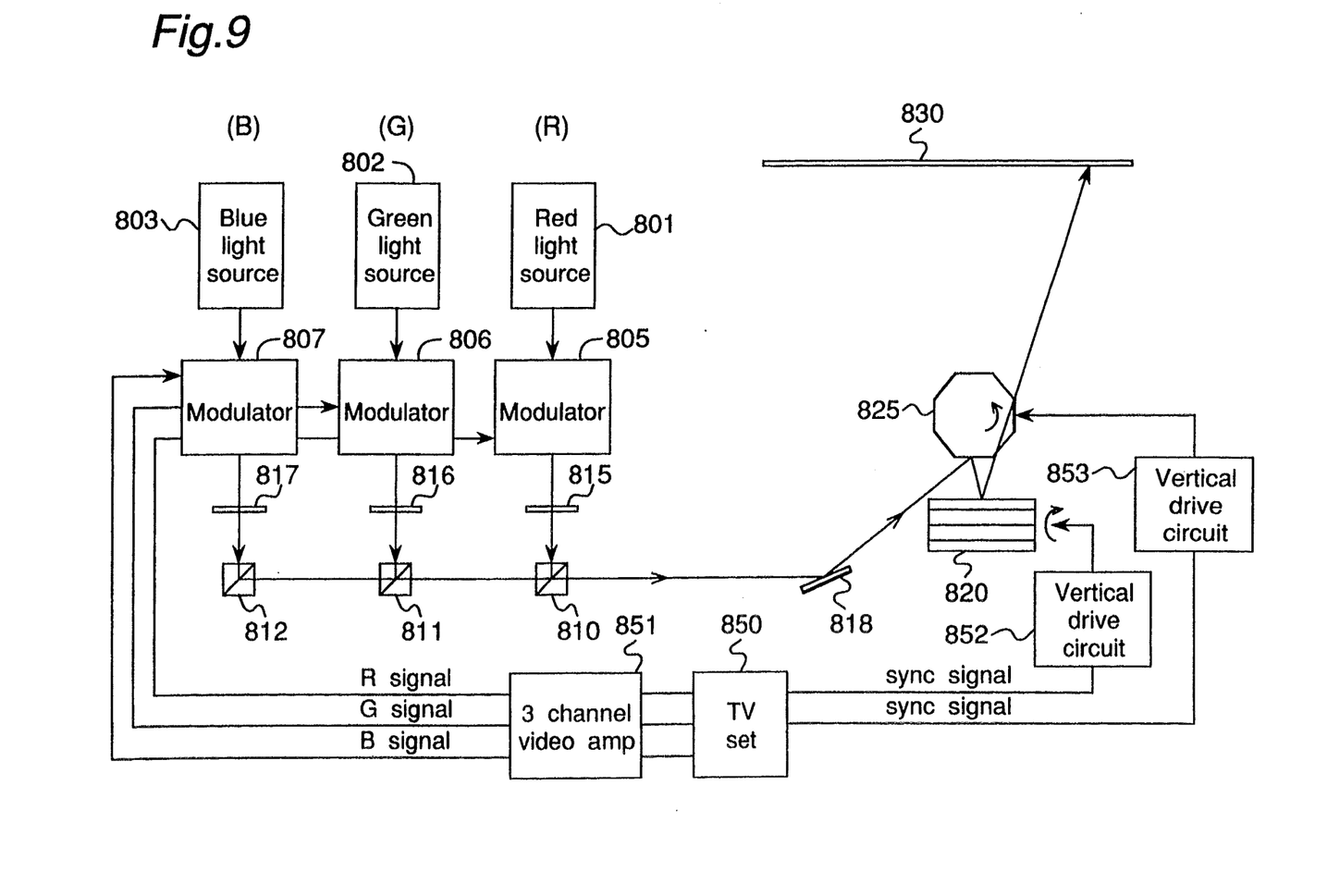
FIG. 9 is diagram of a laser display which uses a laser device according to the invention as a light source.

FIG. 9 shows an example of a laser display which uses a laser device according to the invention. As a red light source 801, a second harmonic wave of Nd:YAG laser of internal resonator type is used which oscillates by using a laser excitation wavelength of 1,320 nm. By using the laser diode of excitation power of 5 W in the longitudinal and transverse multi-mode, a red second harmonic wave output of 2 W of wavelength of 660 nm can be generated. As a green light source 802, a Nd:YVO$_4$ laser is used which oscillates by using a laser excitation wavelength of 1,064 nm. By using the laser diode of excitation power of 3 W in the longitudinal and transverse multi-mode, a green light of 1.6 W of wavelength of 532 nm can be generated. As a blue light source 803, the laser light source of the third embodiment is used. Lights emitted from the light sources 801, 802 and 803 are modulated by modulators 805, 806 and 807 which use acousto-optic effect. The external modulators 805-807 are use because modulation characteristics of the laser diodes used for high power excitation are not good. However, they may be omitted if laser diodes having good modulation characteristics are available. Further, as to the red and green light sources, external modulations are needed in principle, as described above. Lights transmitting the external modulators pass through ND filters 815-817 in order to control quantities of light for good color reproduction, and they are collimated along a same optical axis by dichroic mirrors 810-812. An optical path of the light is adjusted by a reflecting mirror 818 and reflected by a polygon mirror 825 for optical scan along a horizontal direction. The light is further reflected by a mirror 820 for scan in a vertical direction to reach to a screen 830. When a picture of a size of 30 inches is projected onto the screen 830, a picture has a quality similar to that of ordinary NTSC method.

By using a laser device of the invention as a light source, a laser display of a very compact size and a low cost can be produced in contrast to a prior art laser display using a gas laser.

In this embodiment, a scan type laser display is described. However, a laser device of the invention can also be used as a light source of a projection liquid crystal display. In this case, lights from the light sources are collimated along a same optical axis and the light is expanded with a beam expander to a picture size of a liquid crystal module. External modulators using an acousto-optic element is not needed. When speckle noises happen in a picture projected on a screen, they may be avoided by providing a random phase plate, a refraction plate or the like in the optical system. When a laser light source is used, an almost complete collimated light can be obtained easily, and a light only of a target wavelength can be generated. Therefore, a light can be used very efficiently. If an ordinary lamp is used as a light source, unnecessary light such as infrared rays and ultraviolet rays are transformed to heat and heat generation of a liquid crystal module is one of the problems. However, if a laser light source of the invention is used, this problem can be solved.

In the present embodiments of the invention, laser devices using a second harmonic wave are described. However, the invention can also be applied to a laser device which used generation of sum frequency or difference frequency.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A laser device comprising:
 a laser diode;
 a solid state laser medium having a first principal plane for receiving a light emitted from the laser diode and a second one for emitting a light excited by the received light;
 an output mirror provided at a side opposite to the first principal plane; and
 a wavelength converter for converting a wavelength of the light emitted by the solid state laser medium, which wavelength converter being provided between said solid state laser medium and said output mirror;
 wherein an optical resonator for amplifying the laser light emitted by the solid laser medium is constructed between the first principal plane and said output mirror and said solid state laser medium comprises a III-V compound semiconductor crystal or a II-VI compound semiconductor crystal.

2. The laser device according to claim 1, wherein said solid state laser medium comprises at least one selected among a GaAs crystal, a AlGaAs crystal and a GaInP crystal and mixed crystals thereof and superlattice crystals thereof or at least one selected among CdS, CdSe, ZnS, ZnSe, ZnTe, MgS, MgSe and mixed crystals thereof and superlattice crystals thereof.

3. The laser device according to claim 2, further comprising photodetectors for monitoring an excited power of said laser diode and a power of the generated second harmonic wave.

4. The laser device according to claim 2, further comprising a means for controlling a temperature of optical components included in said laser device.

5. The laser device according to claim 2, wherein said second principal plane of said solid state laser medium for contributing optical emission has a diameter about the same as that of a beam emitted by said laser diode.

6. The laser device according to claim 2, wherein a mirror made of a multi-layer dielectric film is formed on said first principal plane of said solid state laser medium, which mirror being able to transmit an excited light emitted by said laser diode and to reflect a fundamental wave efficiently, and said first principal plane is adhered to a sapphire or diamond substrate.

7. The laser device according to claim 6, wherein said sapphire or diamond substrate is held on a holder made of Au, Ag, Cu, Al or an alloy thereof having a thermal conductivity of 100 $W \cdot m^{-1} \cdot K^{-1}$ or higher.

8. The laser device according to claim 2, wherein said solid state laser medium is held directly on a holder member made of Au, Ag, Cu, Al or an alloy thereof having a thermal conductivity of 100 $W \cdot m^{-1} \cdot K^{-1}$ or higher.

9. The laser device according to claim 2, wherein a mirror made of a multi-layer dielectric film is formed on one of the principal planes of said wavelength converter at a side for excitation.

10. The laser device according to claim 2, wherein said wavelength converter is made of at least one nonlinear optical material for wavelength conversion selected among $KTiOPO_4$, $LiNbO_4$, $LiTaO_3$, $LiIO_3$, $\beta$-$BaB_2O_4$, $LiB_3O_5$ or an organic ionic crystal.

11. The laser device according to claim 2, wherein dielectric polarization of the nonlinear optical material of said wavelength converter is reversed periodically.

12. The laser device according to claim 1, further comprising photodetectors for monitoring an excited power of said laser diode and a power of the generated second harmonic wave.

13. The laser device according to claim 1, further comprising a means for controlling a temperature of optical components included in said laser device.

14. The laser device according to claim 1, wherein said second principal plane of said solid state laser medium for contributing optical emission has a diameter about the same as that of a beam emitted by said laser diode.

15. The laser device according to claim 1, wherein a mirror made of a multi-layer dielectric film is formed on said first principal plane of said solid state laser medium, which mirror being able to transmit an excited light emitted by said laser diode and to reflect a fundamental wave efficiently, and said first principal plane is adhered to a sapphire or diamond substrate.

16. The laser device according to claim 15, wherein said sapphire or diamond substrate is held on a holder made of Au, Ag, Cu, Al or an alloy thereof having a thermal conductivity of 100 $W \cdot m^{-1} \cdot K^{-1}$ or higher.

17. The laser device according to claim 1, wherein said solid state laser medium is held directly on a holder member made of Au, Ag, Cu, Al or an alloy thereof having a thermal conductivity of 100 $W \cdot m^{-1} \cdot K^{-1}$ or higher.

18. The laser device according to claim 1, wherein a mirror made of a multi-layer dielectric film is formed on one of the principal planes of said wavelength converter at a side for excitation.

19. The laser device according to claim 18, wherein said wavelength converter is made of at least one nonlinear optical material for wavelength conversion selected among $KTiOPO_4$, $LiNbO_4$, $LiTaO_3$, $LiIO_3$, $\beta$-$BaB_2O_4$, $LiB_3O_5$ or an organic ionic crystal.

20. The laser device according to claim 1, wherein said wavelength converter is made of at least one nonlinear optical material for wavelength conversion selected among $KTiOPO_4$, $LiNbO_4$, $LiTaO_3$, $LiIO_3$, $\beta$-$BaB_2O_4$, $LiB_3O_5$ or an organic ionic crystal.

21. The laser device according to claim 20, wherein dielectric polarization of the nonlinear optical material of said wavelength converter is reversed periodically.

22. The laser device according to claim 1, wherein dielectric polarization of the nonlinear optical material of said wavelength converter is reversed periodically.

* * * * *